United States Patent
Granell et al.

(10) Patent No.: US 12,359,904 B2
(45) Date of Patent: Jul. 15, 2025

(54) METHOD OF MANUFACTURING ANGLE SENSORS INCLUDING MAGNETORESISTANCE ELEMENTS INCLUDING DIFFERENT TYPES OF ANTIFERROMAGNETIC MATERIALS

(71) Applicant: Allegro MicroSystems, LLC, Manchester, NH (US)

(72) Inventors: Pablo Nicolás Granell, Ciudad de Buenos Aires (AR); Samridh Jaiswal, London (GB)

(73) Assignee: Allegro MicroSystems, LLC, Manchester, NH (US)

( * ) Notice: Subject to any disclaimer, the term of this patent is extended or adjusted under 35 U.S.C. 154(b) by 321 days.

(21) Appl. No.: 18/159,748

(22) Filed: Jan. 26, 2023

(65) Prior Publication Data

US 2024/0255269 A1   Aug. 1, 2024

(51) Int. Cl.
*G01B 7/30* (2006.01)
*G01D 5/16* (2006.01)

(52) U.S. Cl.
CPC ....... *G01B 7/30* (2013.01); *G01D 5/16* (2013.01)

(58) Field of Classification Search
CPC ............. G01B 7/30; G01R 33/0052; G01R 33/09–098; G01D 5/12; G01D 5/14; G01D 5/16
See application file for complete search history.

(56) References Cited

U.S. PATENT DOCUMENTS

| | | | |
|---|---|---|---|
| 5,282,104 A | | 1/1994 | Coutellier et al. |
| 5,344,669 A | * | 9/1994 | Chen ............. G11B 5/399 427/132 |

(Continued)

FOREIGN PATENT DOCUMENTS

| | | |
|---|---|---|
| CN | 201622299 | 11/2010 |
| CN | 101900754 | 12/2010 |

(Continued)

OTHER PUBLICATIONS

U.S. Appl. No. 18/175,829, filed Feb. 28, 2023, Lassalle-Balier et al.
Childress et al; "Spin-Valve and Tunnel-Valve Structures with In Situ In-Stack Bias;" IEEE Transactions on Magnetics, vol. 38, No. 5; Sep. 2002; pp. 2286-2288; 3 Pages.

(Continued)

*Primary Examiner* — Huy Q Phan
*Assistant Examiner* — David B Frederiksen
(74) *Attorney, Agent, or Firm* — Daly, Crowley, Mofford & Durkee, LLP

(57) ABSTRACT

In one aspect, manufacturing a magnetic-field angle sensor includes heating, to a first temperature, a substrate, which includes heating a first magnetoresistance (MR) element including a first type of antiferromagnetic material having a first Néel temperature and a first magnetization direction and heating a second MR element including a second type of antiferromagnetic material having a second Néel temperature and a second magnetization direction. The manufacturing also includes, after heating the substrate to the first temperature, applying a first magnetic field to the substrate in an x-direction to enable a first magnetization direction and a second magnetization direction to be in the x-direction, enabling a temperature of the substrate to be a second temperature and applying a second magnetic field to the substrate in a y-direction to enable the second magnetization direction to be in the y-direction while the first magnetization direction remains in the x-direction.

22 Claims, 10 Drawing Sheets

(56) References Cited

U.S. PATENT DOCUMENTS

| | | | |
|---|---|---|---|
| 5,492,720 A * | 2/1996 | Gill | G11B 5/3932 427/132 |
| 5,677,625 A | 10/1997 | Dieny | |
| 5,686,838 A | 11/1997 | van den Berg | |
| 5,821,517 A | 10/1998 | Fedeli et al. | |
| 5,858,125 A | 1/1999 | Hasegawa | |
| 5,895,727 A | 4/1999 | Hasegawa | |
| 5,923,514 A | 7/1999 | Scott et al. | |
| 5,933,306 A | 8/1999 | Santos et al. | |
| 6,013,365 A | 1/2000 | Dieny et al. | |
| 6,026,355 A | 2/2000 | Rahman et al. | |
| 6,069,476 A | 5/2000 | Vieux-Rochaz et al. | |
| 6,094,330 A | 7/2000 | Criniti et al. | |
| 6,141,197 A | 10/2000 | Kim et al. | |
| 6,181,533 B1 * | 1/2001 | Pokhil | B82Y 40/00 324/252 |
| 6,373,247 B1 | 4/2002 | Marx et al. | |
| 6,429,640 B1 | 8/2002 | Daughton et al. | |
| 6,430,012 B1 * | 8/2002 | Sano | H01F 10/123 324/252 |
| 6,462,641 B1 | 10/2002 | Dieny et al. | |
| 6,490,140 B1 | 12/2002 | Mao et al. | |
| 6,522,132 B1 | 2/2003 | Vieus-Rochaz et al. | |
| 6,532,164 B2 | 3/2003 | Redon et al. | |
| 6,549,382 B1 | 4/2003 | Gill | |
| 6,556,390 B1 | 4/2003 | Mao et al. | |
| 6,603,677 B2 | 8/2003 | Redon et al. | |
| 6,738,236 B1 | 5/2004 | Mao et al. | |
| 6,770,382 B1 | 8/2004 | Chang et al. | |
| 6,888,742 B1 | 5/2005 | Nguyen et al. | |
| 6,982,855 B2 * | 1/2006 | Shimazawa | B82Y 10/00 |
| 7,095,596 B2 | 8/2006 | Schmollngruber et al. | |
| 7,106,046 B2 | 9/2006 | Nagano et al. | |
| 7,176,679 B2 | 2/2007 | Baragatti et al. | |
| 7,288,931 B2 | 10/2007 | Granig et al. | |
| 7,324,312 B2 | 1/2008 | Gill | |
| 7,324,313 B2 | 1/2008 | Childress et al. | |
| 7,342,753 B2 | 3/2008 | Gill | |
| 7,394,247 B1 | 7/2008 | Guo et al. | |
| 7,397,637 B2 | 7/2008 | Gill | |
| 7,453,672 B2 | 11/2008 | Dieny et al. | |
| 7,463,016 B2 | 12/2008 | Shoji | |
| 7,472,004 B2 | 12/2008 | Hara et al. | |
| 7,713,755 B1 | 5/2010 | Xiao | |
| 7,759,933 B2 | 7/2010 | Coillot et al. | |
| 7,813,202 B2 | 10/2010 | Rodmacq et al. | |
| 7,855,555 B2 | 12/2010 | Biziere et al. | |
| 7,902,811 B2 | 3/2011 | Shoji | |
| 7,944,205 B2 | 5/2011 | Fermon et al. | |
| 7,944,736 B2 | 5/2011 | Dieny et al. | |
| 7,999,338 B2 | 8/2011 | Zheng et al. | |
| 8,093,886 B2 | 1/2012 | Okada et al. | |
| 8,129,988 B2 | 3/2012 | Fermon et al. | |
| 8,223,463 B2 | 7/2012 | Katada et al. | |
| 8,279,666 B2 | 10/2012 | Dieny et al. | |
| 8,487,701 B2 | 7/2013 | Boujamaa et al. | |
| 8,513,944 B2 | 8/2013 | Rodmacq et al. | |
| 8,542,072 B2 | 9/2013 | Dieny et al. | |
| 8,624,590 B2 | 1/2014 | Dieny | |
| 8,669,122 B2 | 3/2014 | Viala et al. | |
| 8,779,764 B2 | 7/2014 | Meguro et al. | |
| 8,836,317 B2 | 9/2014 | Kasajima | |
| 8,847,589 B2 | 9/2014 | Walther et al. | |
| 9,431,031 B1 | 8/2016 | Xiao et al. | |
| 9,529,060 B2 | 12/2016 | Fermon et al. | |
| 9,666,214 B1 | 5/2017 | Bertero et al. | |
| 9,741,372 B1 | 8/2017 | Campiglio | |
| 9,804,234 B2 | 10/2017 | Dressler et al. | |
| 9,812,637 B2 | 11/2017 | Fermon et al. | |
| 9,922,673 B2 | 3/2018 | Campiglio et al. | |
| 10,347,277 B2 | 7/2019 | Campiglio et al. | |
| 10,557,726 B2 | 2/2020 | Lassalle-Balier et al. | |
| 10,620,279 B2 | 4/2020 | Campiglio et al. | |
| 10,734,443 B2 | 8/2020 | Lassalle-Balier et al. | |
| 10,753,989 B2 | 8/2020 | Campiglio et al. | |
| 10,762,941 B2 | 9/2020 | Shiokawa | |
| 10,840,001 B2 | 11/2020 | Lassalle-Balier et al. | |
| 10,935,612 B2 | 3/2021 | Belin et al. | |
| 11,199,424 B2 | 12/2021 | Lassalle-Balier et al. | |
| 2001/0030839 A1 | 10/2001 | Zhong et al. | |
| 2002/0036315 A1 | 3/2002 | Adachi et al. | |
| 2002/0061421 A1 | 5/2002 | Dieny | |
| 2002/0158626 A1 | 10/2002 | Shay et al. | |
| 2002/0171417 A1 | 11/2002 | Schoedlbauer | |
| 2002/0186513 A1 | 12/2002 | Heinonen et al. | |
| 2002/0191348 A1 | 12/2002 | Hasegawa et al. | |
| 2003/0020471 A1 | 1/2003 | Kohlstedt | |
| 2003/0053266 A1 | 3/2003 | Dieny et al. | |
| 2003/0053270 A1 | 3/2003 | Gill | |
| 2003/0058587 A1 | 3/2003 | Hasegawa et al. | |
| 2003/0070497 A1 | 4/2003 | Kikuchi et al. | |
| 2003/0184918 A1 | 10/2003 | Lin et al. | |
| 2003/0218840 A1 | 11/2003 | Apel et al. | |
| 2003/0226409 A1 | 12/2003 | Steele et al. | |
| 2003/0235016 A1 | 12/2003 | Gill | |
| 2004/0008454 A1 | 1/2004 | Gill | |
| 2004/0056647 A1 | 3/2004 | Stauth et al. | |
| 2004/0056654 A1 | 3/2004 | Goldfine et al. | |
| 2004/0207035 A1 | 10/2004 | Witcraft et al. | |
| 2004/0263157 A1 | 12/2004 | Sudo et al. | |
| 2006/0038407 A1 | 2/2006 | Shelley et al. | |
| 2006/0072249 A1 | 4/2006 | Wakui et al. | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0152859 A1 | 7/2006 | Childress et al. | |
| 2006/0193089 A1 | 8/2006 | Li et al. | |
| 2006/0214656 A1 | 9/2006 | Sudo et al. | |
| 2007/0019338 A1 | 1/2007 | Childress et al. | |
| 2007/0019341 A1 | 1/2007 | Mizuno et al. | |
| 2007/0044370 A1 | 3/2007 | Shoji | |
| 2007/0063237 A1 | 3/2007 | Huai et al. | |
| 2007/0064350 A1 | 3/2007 | Gill | |
| 2007/0076332 A1 | 4/2007 | Shoji et al. | |
| 2007/0164734 A1 | 7/2007 | Shimizu et al. | |
| 2007/0230067 A1 | 10/2007 | Jogo et al. | |
| 2007/0230068 A1 | 10/2007 | Gill | |
| 2008/0031035 A1 | 2/2008 | Rodmaco et al. | |
| 2008/0042779 A1 | 2/2008 | Carey et al. | |
| 2008/0098167 A1 | 4/2008 | Rodmaco et al. | |
| 2008/0117552 A1 | 5/2008 | Zhou et al. | |
| 2008/0151615 A1 | 6/2008 | Rodmacq et al. | |
| 2008/0316655 A1 | 12/2008 | Shoji | |
| 2009/0002898 A1 | 1/2009 | Childress et al. | |
| 2009/0015972 A1 | 1/2009 | Dieny et al. | |
| 2009/0021249 A1 | 1/2009 | Kumar et al. | |
| 2009/0087589 A1 | 4/2009 | Guo et al. | |
| 2009/0115405 A1 | 5/2009 | Guo | |
| 2009/0189601 A1 | 7/2009 | Okada et al. | |
| 2009/0192755 A1 | 7/2009 | Sheiretov et al. | |
| 2009/0206831 A1 | 8/2009 | Fermon et al. | |
| 2009/0289694 A1 | 11/2009 | Rieger et al. | |
| 2009/0290053 A1 | 11/2009 | Hammerschmidt | |
| 2010/0027168 A1 | 2/2010 | Chou et al. | |
| 2010/0039734 A1 | 2/2010 | Hara et al. | |
| 2010/0045277 A1 | 2/2010 | Goldfine et al. | |
| 2010/0060263 A1 | 3/2010 | Granig et al. | |
| 2010/0149689 A1 | 6/2010 | Tsuchiya et al. | |
| 2010/0327857 A1 | 12/2010 | Hoshiya et al. | |
| 2011/0013317 A1 | 1/2011 | Kaiser et al. | |
| 2011/0025320 A1 | 2/2011 | Ohta et al. | |
| 2011/0062537 A1 | 3/2011 | Oh et al. | |
| 2011/0068786 A1 | 3/2011 | Miura et al. | |
| 2011/0133728 A1 | 6/2011 | Tokunaga | |
| 2011/0140217 A1 | 6/2011 | Nguyen et al. | |
| 2011/0163739 A1 | 7/2011 | Ono et al. | |
| 2012/0112741 A1 | 5/2012 | Meguro et al. | |
| 2013/0082696 A1 | 4/2013 | Le et al. | |
| 2013/0161770 A1 | 6/2013 | Meng et al. | |
| 2013/0221949 A1 * | 8/2013 | Liu | G01R 33/093 324/202 |
| 2014/0001585 A1 | 1/2014 | Dimitrov et al. | |
| 2014/0111195 A1 | 4/2014 | Kuo et al. | |
| 2014/0168818 A1 | 6/2014 | Sapozhnikov et al. | |

(56) References Cited

U.S. PATENT DOCUMENTS

| | | | |
|---|---|---|---|
| 2014/0268405 | A1 | 9/2014 | Machita et al. |
| 2014/0293474 | A1 | 10/2014 | Yamane et al. |
| 2015/0002962 | A1 | 1/2015 | Singleton et al. |
| 2015/0147481 | A1 | 5/2015 | Braganca et al. |
| 2015/0194597 | A1* | 7/2015 | Fermon ............... H01F 41/306 257/421 |
| 2015/0228321 | A1 | 8/2015 | Lee et al. |
| 2016/0072052 | A1* | 3/2016 | Noma .................. H10N 50/01 257/421 |
| 2017/0194023 | A1 | 7/2017 | Okawa et al. |
| 2019/0178954 | A1 | 6/2019 | Lassalle-Balier et al. |
| 2019/0259520 | A1 | 8/2019 | Lassalle-Balier et al. |
| 2020/0076369 | A1 | 3/2020 | Nunn et al. |
| 2022/0244328 | A1 | 8/2022 | Lassalle-Balier et al. |

FOREIGN PATENT DOCUMENTS

| | | |
|---|---|---|
| DE | 19 810 838 | 9/1999 |
| DE | 19 843 348 | 3/2000 |
| DE | 10 222 467 | 12/2003 |
| DE | 10 257 253 | 2/2004 |
| DE | 10 2005 024 879 | 12/2006 |
| DE | 10 2005 042 307 | 3/2007 |
| DE | 10 2006 019 483 | 10/2007 |
| DE | 10 2008 030 334 | 1/2010 |
| EP | 0 779 632 | 6/1997 |
| EP | 0 863 406 | 9/1998 |
| EP | 1 323 856 | 7/2003 |
| EP | 1 510 787 | 3/2005 |
| EP | 1 617 472 | 1/2006 |
| EP | 1 666 894 | 6/2006 |
| EP | 1 672 321 | 6/2006 |
| EP | 1 777 440 | 4/2007 |
| EP | 1 918 678 | 5/2008 |
| EP | 1 947 469 | 7/2008 |
| FR | 2 727 778 | 6/1996 |
| FR | 2 729 790 | 7/1996 |
| FR | 2 752 302 | 2/1998 |
| FR | 2 773 395 | 7/1999 |
| FR | 2 774 774 | 8/1999 |
| FR | 2 814 592 | 3/2002 |
| FR | 2 817 998 | 6/2002 |
| FR | 2 817 999 | 6/2002 |
| FR | 2 830 621 | 4/2003 |
| FR | 2 876 800 | 4/2006 |
| FR | 2 889 348 | 2/2007 |
| FR | 2 932 315 | 12/2009 |
| JP | 2000-055997 | 2/2000 |
| JP | 2000-055999 | 2/2000 |
| JP | 2000-056000 | 2/2000 |
| JP | 2001-230471 | 8/2001 |
| JP | 2002-082136 | 3/2002 |
| JP | 2002-267692 | 9/2002 |
| JP | 2002-328140 | 11/2002 |
| JP | 2003-174217 A | 6/2003 |
| JP | 2003-315091 | 11/2003 |
| JP | 2006-179566 A | 7/2006 |
| JP | 2006-214091 | 8/2006 |
| JP | 2007-101253 | 4/2007 |
| JP | 2007-108069 | 4/2007 |
| JP | 2009-014544 | 1/2009 |
| KR | 2006-0125913 A | 12/2006 |
| WO | WO 94/15223 | 7/1994 |
| WO | WO 01/67460 A1 | 9/2001 |
| WO | WO 2001/067085 | 9/2001 |
| WO | WO 2002/084680 | 10/2002 |
| WO | WO 2003/032338 | 4/2003 |
| WO | WO 2003/0104829 | 12/2003 |
| WO | WO 2003/0107018 | 12/2003 |
| WO | WO 2004/048986 | 6/2004 |
| WO | WO 2004/068152 | 8/2004 |
| WO | WO 2004/068158 | 8/2004 |
| WO | WO 2005/020242 | 3/2005 |
| WO | WO 2005/028993 | 3/2005 |
| WO | WO 2006/136577 | 12/2006 |
| WO | WO 2007/095971 | 8/2007 |
| WO | WO 2007/148028 | 12/2007 |
| WO | WO 2007/148029 | 12/2007 |
| WO | WO 2008/012309 | 1/2008 |
| WO | WO 2008/015354 | 2/2008 |
| WO | WO 2009/001160 | 12/2008 |
| WO | WO 2009/001162 | 12/2008 |
| WO | WO 2009/007324 | 1/2009 |
| WO | WO 2009/110892 | 9/2009 |
| WO | WO 2010/001077 | 1/2010 |
| WO | WO 2010/026948 | 3/2010 |
| WO | WO 2010/066976 | 6/2010 |
| WO | WO 2010/084165 | 7/2010 |
| WO | WO 2010/113820 | 10/2010 |
| WO | WO 2010/116102 | 10/2010 |
| WO | WO 2011/007767 | 1/2011 |
| WO | WO 2010/136527 | 12/2012 |

OTHER PUBLICATIONS

Coehoorn, Lecture Notes; "Chapter 2: Structure and Transport Properties of Conventional and Advanced Spin-Valves;" from *Novel Magnetoelectronic Materials and Devices*; Jan. 2003; pp. 33-84; 52 Pages.

Fermon et al.; "Optimised GMR Sensors for Low and High Frequencies Applications;" Elsevier, Sensors and Actuators, Jan. 2006; 4 pages.

Noziéres et al.; "Blocking Temperature Distribution and Long-Term Stability of Spin-Vavle Structures with Mn-Based Antiferromagnets;" Journal of Applied Physics, vol. 87, No. 8; Apr. 15, 2000; pp. 3920-3925; 6 Pages.

Office Action/Restriction Requirement dated Apr. 20, 2015; for U.S. Appl. No. 14/529,564; 9 pages.

Response filed Apr. 28, 2015; to Office Action/Restriction Requirement dated Apr. 20, 2015; for U.S. Appl. No. 14/529,564; 1 page.

Non-Final Office Action dated Jun. 17, 2015; for U.S. Appl. No. 14/529,564; 26 pages.

Response filed on Nov. 17, 2015 to Non-Final Office Action dated Jun. 17, 2015; For U.S. Appl. No. 14/529,564; 19 pages.

Final Office Action dated Feb. 4, 2016; For U.S. Appl. No. 14/529,564; 24 pages.

Response filed on Apr. 29, 2016 to Final Office Action dated Feb. 4, 2016; For U.S. Appl. No. 14/529,564; 17 pages.

Non-Final Office Action dated Jun. 23, 2016; For U.S. Appl. No. 14/529,564; 17 pages.

Response filed on Sep. 12, 2016; to Office Action dated Jun. 23, 2016 for U.S. Appl. No. 14/255, 166; 25 pages.

PCT Search Report and Written Opinion of the ISA dated Jun. 2, 2015; for PCT Pat. App. No. PCT/US2015/010417; 13 pages.

PCT Search Report and Written Opinion of the ISA dated Jun. 2, 2015; for PCT Pat. App. No. PCT/US2015/010422; 12 pages.

PCT International Search Report and Written Opinion dated Aug. 10, 2016 corresponding to International Application No. PCT/US2016/034237; 21 Pages.

PCT International Preliminary Report on Patentability and Written Opinion dated Jul. 21, 2016 corresponding to International Application No. PCT/US2015/010422; 9 Pages.

U.S. Restriction Requirement dated Oct. 1, 2015 for U.S. Appl. No. 14/452,783; 8 Pages.

Response to U.S. Restriction Requirement dated Oct. 1, 2015 for U.S. Appl. No. 14/452,783; Response filed Nov. 20, 2015; 1 Page.

U.S. Non-Final Office Action dated Dec. 31, 2015 for U.S. Appl. No. 14/452,783; 14 Pages.

Response to U.S. Non-Final Office Action dated Dec. 31, 2015 for U.S. Appl. No. 14/452,783; Response filed Apr. 20, 2016; 13 Pages.

U.S. 1$^{st}$ Notice of Allowance dated Jul. 6, 2016 for U.S. Appl. No. 14/452,783; 10 Pages.

U.S. 2$^{nd}$ Notice of Allowance dated Oct. 7, 2016 for U.S. Appl. No. 14/452,783; 9 Pages.

European Intention to Grant dated Jul. 26, 2019 for European Application No. 15701862.3; 7 Pages.

Japanese 1$^{st}$ Office Action (with Machine English Translation) dated Dec. 11, 2018 for Japanese Application No. 2016-545809; 17 Pages.

(56) References Cited

OTHER PUBLICATIONS

Response (with Machine English Translation) to Japanese Office Action dated Dec. 11, 2018 for Japanese Application No. 2016-545809; Response filed Feb. 19, 2019; 21 Pages.
Japanese 2nd Office Action (with Machine English Translation) dated Jun. 4, 2019 for Japanese Application No. 2016-545809; 17 Pages.
Response (with Machine English Translation) to Japanese 2nd Office Action dated Jun. 4, 2019 for Japanese Application No. 2016-545809; Response filed Aug. 30, 2019; 17 Pages.
Japanese Decision to Grant (with Machine English Translation) dated Sep. 30, 2019 for Japanese Application No. 2016-545809; 11 Pages.
Korean 1st Office Action (with machine English Translation) dated Nov. 24, 2020 for Korean Application No. 10-2016-7021481; 15 Pages.
Response (with Machine English Translation) to Korean 1st Office Action dated Nov. 24, 2020 for Korean Application No. 10-2016-7021481; Response filed Jan. 21, 2021; 80 Pages.
Korean 2nd Office Action (with Machine English Translation) dated May 27, 2021 for Korean Application No. 10-2016-7021481; 8 Pages.
Response (with Machine English Translation) to Korean 2nd Office Action dated May 27, 2021 for Korean Application No. 10-2016-7021481; Response filed Jul. 26, 2021; 65 Pages.
Korean Notice of Allowance (with Machine English Translation) dated Nov. 22, 2021 for Korean Application No. 10-2016-7021481; 10 Pages.
Extended European Search Report dated Aug. 8, 2019 for European Application No. 19161147.4; 8 Pages.
Response to European Office Action dated Mar. 11, 2020 for European Application No. 19161147.4; Response filed on Mar. 6, 2019; 19 Pages.
U.S. Preliminary Amendment filed on Mar. 7, 2019 for U.S. Appl. No. 15/913,072; 8 Pages.
U.S. Restriction Requirement dated Dec. 31, 2019 for U.S. Appl. No. 15/913,072; 5 Pages.
Response to U.S. Restriction Requirement dated Dec. 31, 2019 for U.S. Appl. No. 15/913,072; Response filed Jan. 29, 2020; 1 Page.
U.S. Non-Final Office Action dated Apr. 7, 2020 for U.S. Appl. No. 15/913,072; 14 Pages.
Response to U.S. Non-Final Office Action dated Apr. 7, 2020 for U.S. Appl. No. 15/913,072; Response filed Jun. 30, 2020; 13 Pages.
U.S. Notice of Allowance dated Sep. 21, 2020 for U.S. Appl. No. 15/913,072; 8 Pages.
European Examination Report dated Nov. 3, 2021 for European Application No. 19161147.4; 5 Pages.
Response to European Examination Report dated Nov. 3, 2021 for European Application No. 19161147.4; Response filed Mar. 14, 2022; 18 Pages.
Intention of Grant dated Aug. 4, 2023 for European Application No. 19161147.4; 7 pages.

\* cited by examiner

METHOD OF MANUFACTURING ANGLE SENSORS INCLUDING MAGNETORESISTANCE ELEMENTS INCLUDING DIFFERENT TYPES OF ANTIFERROMAGNETIC MATERIALS

BACKGROUND

A magnetic field angle sensor is one example of a magnetic field sensing element. The magnetic field sensing element is used to describe a variety of electronic elements that can sense a magnetic field. The magnetic field sensing element can be, but is not limited to, a Hall Effect element, a magnetoresistance (MR) element, or a magnetotransistor. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge.

Generally, GMR, TMR, and MTJ elements include a reference layer. The magnetization direction of a reference layer determines a direction where the MR element is most sensitive to changes to a magnetic field. The reference layer is generally comprised of a ferromagnetic (FM) layer/antiferromagnetic (AFM) layer system, where the FM layer is directly coupled to the AFM layer via an exchange interaction and is therefore said to be "pinned". The magnetization direction of the reference layer can be pinned in a desired direction by heating the reference layer to a particular temperature, applying a magnetic field on the reference layer in the desired direction, and subsequently cooling the reference layer in the presence of the magnetic field. This temperature is given as the Néel temperature ($T_N$) of the AFM layer. At the Neel temperature the AF layer transitions from an ordered antiferromagnetic state into a disordered paramagnetic state.

A laser pinning process is a pinning methodology primarily used in two-dimensional (2D) magnetic field angle sensors to pin the magnetization directions of the reference layers for each individual X, Y bridge, which enables the feature of locally setting two distinct directions and obtain a full 0 to 360 degree of functionality on the same die.

SUMMARY

In one aspect, a method includes manufacturing a magnetic-field angle sensor. The manufacturing includes heating, to a first temperature, a substrate. The heating includes heating a first magnetoresistance (MR) element including a first type of antiferromagnetic material having a first Néel temperature and a first magnetization direction and heating a second MR element including a second type of antiferromagnetic material having a second Néel temperature and a second magnetization direction. The manufacturing also includes, after heating the substrate to the first temperature, applying a first magnetic field to the substrate in an x-direction to enable the first magnetization direction and the second magnetization direction to be in the x-direction, cooling the substrate to a temperature less than the first Néel temperature while applying the first magnetic field, enabling a temperature of the substrate to be a second temperature after ceasing to apply the first magnetic field, and applying a second magnetic field to the substrate in a y-direction to enable the second magnetization direction to be in the y-direction. The first Néel temperature is greater than the second Néel temperature, and the first temperature is greater than the first Néel temperature. The second temperature is less than the first Néel temperature and greater than the second Néel temperature.

In another aspect, a magnetic-field angle sensor includes a first bridge comprising magnetoresistance (MR) elements each comprising a first type of antiferromagnetic material having a first Néel temperature and a first magnetization direction; and a second bridge comprising MR elements comprising a second type of antiferromagnetic material having a second Néel temperature and a second magnetization direction. The first magnetization direction is orthogonal to the second magnetization direction, and the first Néel temperature is higher than the second Néel temperature.

In a further aspect, a method includes manufacturing a magnetic-field angle sensor. The manufacturing includes heating, to a first temperature, a substrate, which includes heating a first magnetoresistance (MR) element comprising a first type of antiferromagnetic material having a first blocking temperature and a first magnetization direction and heating a second MR element comprising a second type of antiferromagnetic material having a second blocking temperature and a second magnetization direction. The manufacturing also includes, after heating the substrate to the first temperature, applying a first magnetic field to the substrate in an x-direction to enable the first magnetization direction and the second magnetization direction to be in the x-direction, cooling the substrate to a temperature less than the first blocking temperature while applying the first magnetic field, enabling a temperature of the substrate to be a second temperature after ceasing to apply the first magnetic field, and applying a second magnetic field to the substrate in a y-direction to enable the second magnetization direction to be in the y-direction. The first blocking temperature is greater than the second blocking temperature, and the first temperature is greater than the first blocking temperature. The second temperature is less than the first blocking temperature and greater than the second blocking temperature.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate an angle sensor with magnetoresistance (MR) elements having different antiferromagnetic materials. The techniques described herein tune Néel temperatures of antiferromagnetic materials to eliminate a laser repinning process. In one example, the techniques described herein improve the fabrication of MR elements used in a two-dimensional (2D) magnetic field angle sensor. In another example, the techniques described herein improve the fabrication of MR elements used in a three-dimensional (3D) magnetic field angle sensor.

Figure 1:
FIG. 1 is a block diagram of an example of a magnetoresistance (MR) element.

Referring to FIG. 1, an example of a magnetoresistance element is a stack 100. As one of ordinary skill in the art would recognize, FIG. 1 merely shows a simplified diagram of a magnetoresistance element. Other layers may be added to the stack 100 that are not shown in FIG. 1.

The stack 100 includes a ferromagnetic material 102, a ferromagnetic material 110, and a non-magnetic material 106 between the ferromagnetic material 102 and the ferromagnetic material 110. In one example, the non-magnetic material 106 may be a tunneling barrier/spacer (non-magnetic insulator, e.g., MgO) if the stack 100 is a TMR stack. In another example, the non-magnetic material 106 may be a metal (e.g., Cu) if the stack 100 is a GMR stack. The stack 100 also includes an antiferromagnetic material 116 below the ferromagnetic material 110.

In one example, the stack 100 is a spin valve. In one example, the stack is tunneling magnetoresistance (TMR) element. In another example, the stack 100 is a giant magnetoresistance (GMR) element. In a further example, the stack 100 is both a GMR element and a TMR element.

The ferromagnetic material 102 is a free layer and the ferromagnetic material 110 has a pinned magnetization direction. The antiferromagnetic material 116 is a pinning layer. The metal 106 is a non-magnetic spacer.

The ferromagnetic material 110 is directly coupled to the antiferromagnetic material 116 via exchange interaction. The pinning of ferromagnetic material 110 is achieved by heating the structure above the Néel temperature of the antiferromagnetic material 116, applying a magnetic field in the desired pinning direction, and cooling down below the Néel temperature without removing the applied magnetic field. As a result of this magnetic field cooling, the magnetization direction of ferromagnetic material 110 is aligned to the desired direction and pinned by the antiferromagnetic material 116.

Since this procedure is commonly done at the wafer-level in an oven, aligning individual sensing bridges (e.g., cosine bridge (sometimes called herein an x-bridge), sine bridge (sometimes called herein a y-bridge)) is not possible, which is a limiting factor for building angle sensor applications. One possible way to achieve local pinning is to add a repinning process after the first annealing, where a laser heats locally individual MR elements in a bridge and a magnetic field is applied during this process to re-orient them. This, however, is not the most suitable method as repinning involves additional costs in set-up, issues with temperature control and heat dissipation across the wafer via laser heating and requires great control in wafer alignment and laser stability for local re-pinning. Moreover, laser pinning to locally re-pin a stack after the wafer is fabricated causes difficulty in end of line monitoring.

As further described in conjunction with FIGS. 2A to 5, an angle sensor may be fabricated with MR elements having different antiferromagnetic materials by tuning Néel temperatures of the antiferromagnetic materials to eliminate use of laser repinning processes.

Figure 2A:
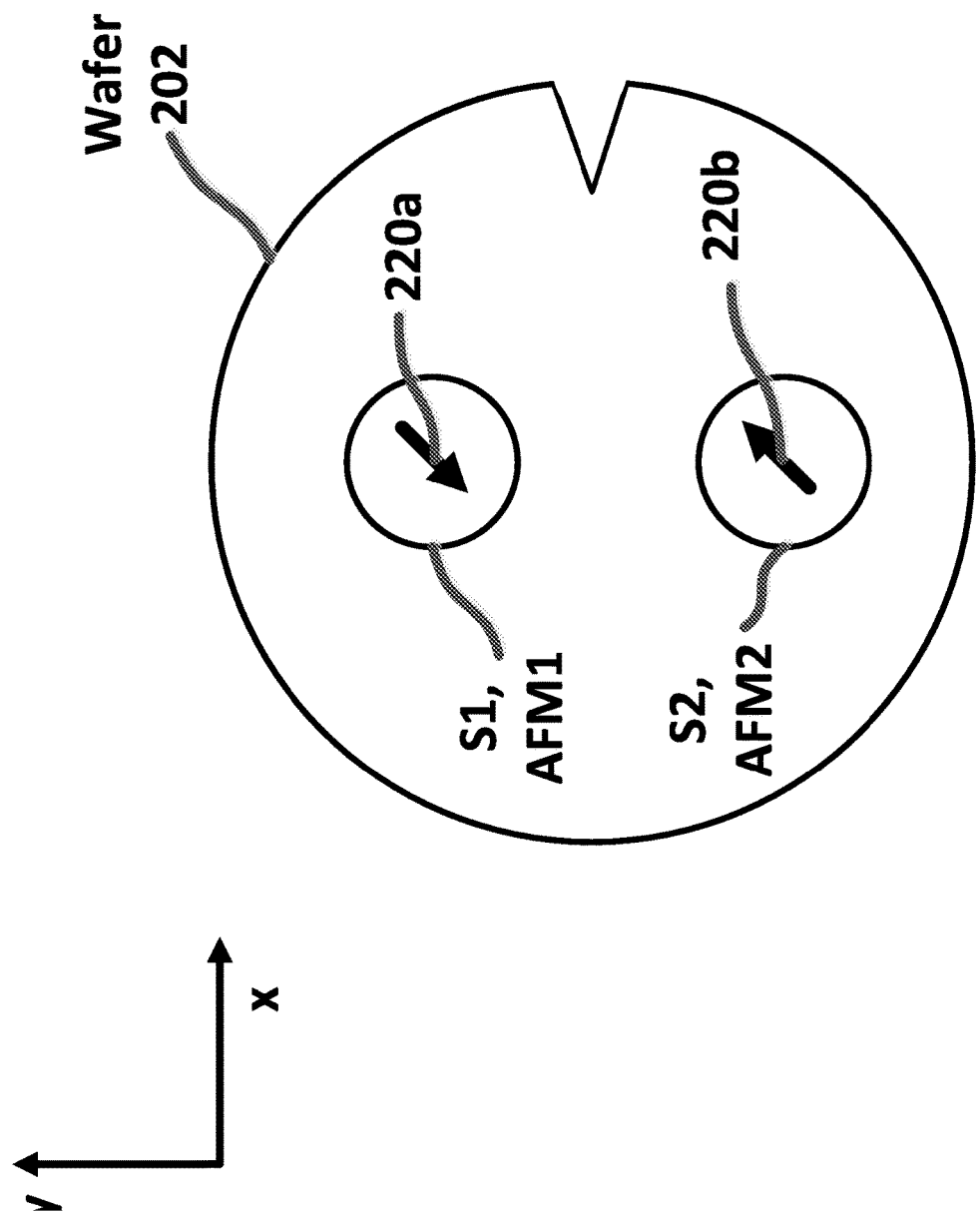
FIGS. 2A to 2C are diagrams depicting setting magnetization directions for two types of antiferromagnetic materials having different Néel temperatures.

Referring to FIG. 2A, a wafer 202 includes a first MR element stack S1 with a first type of antiferromagnetic material (AFM1), and a second MR element stack S2 with a second type of antiferromagnetic material (AFM2). The AFM1 has a Néel temperature $T_{N(AF1)}$ and the AFM2 has a Néel temperature $T_{N(AF2)}$ where $T_{N(AF1)} > T_{N(AF2)}$. A magnetization direction 220a of the AFM1 and a magnetization direction 220b of the AFM2 are random.

In one example, AFM1 may be iridium manganese (IrMn), iron manganese (FeMn), or platinum manganese (PtMn). In another example, AFM2 may be iridium manganese (IrMn), iron manganese (FeMn), or platinum manganese (PtMn). The examples in the paragraph are limited to $T_{N(AF1)} > T_{N(AF2)}$.

Figure 2B:
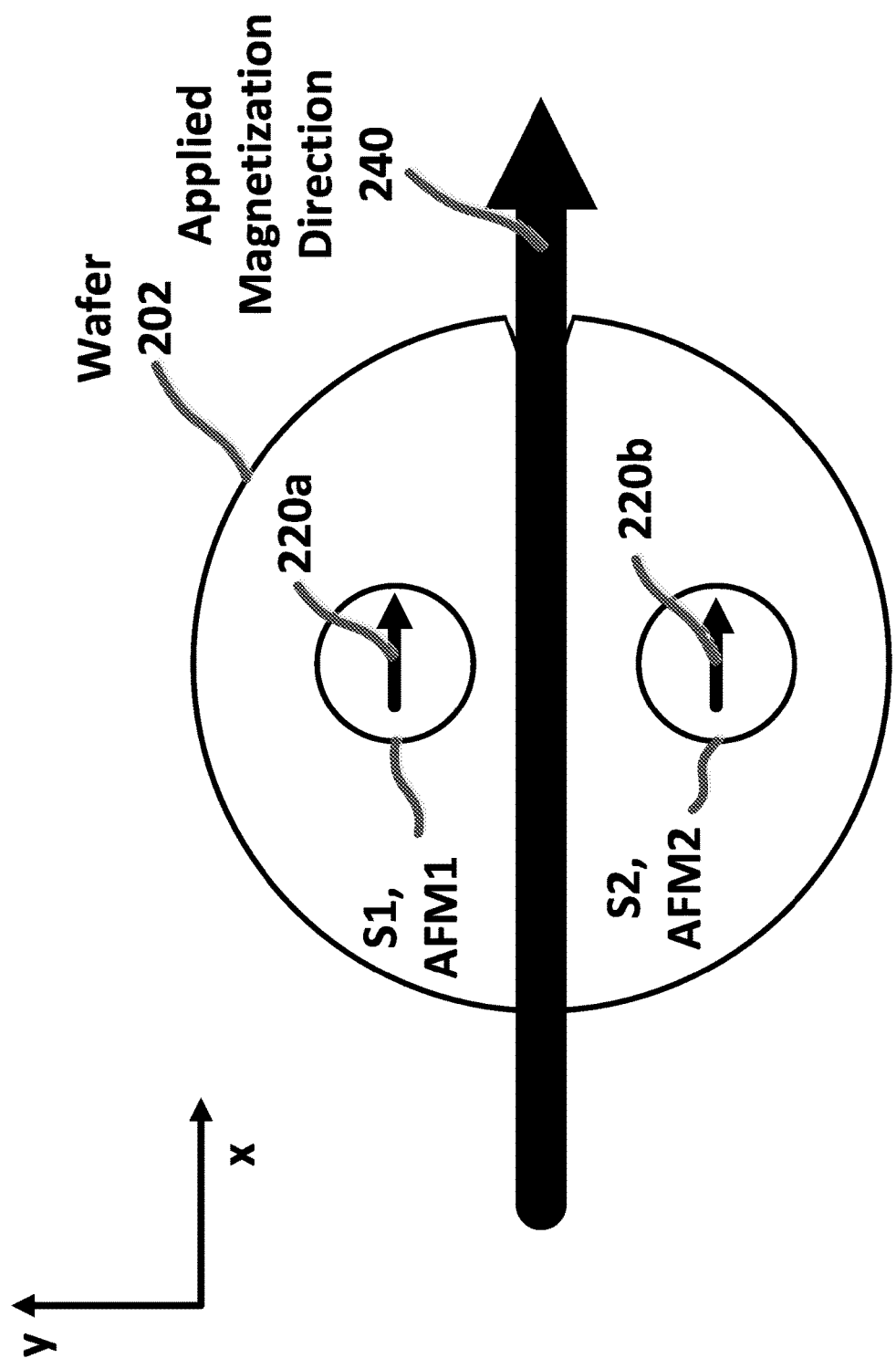

Referring to FIG. 2B, after heating the wafer 202 to a first temperature greater than $T_{N(AF1)}$, a magnetic field 240 is applied to the wafer 202 in the x-direction. The magnetization direction 220a of AFM1 and the magnetization direction 220b of AFM2 align with the applied magnetic field 240 and point in the x-direction.

Figure 2C:
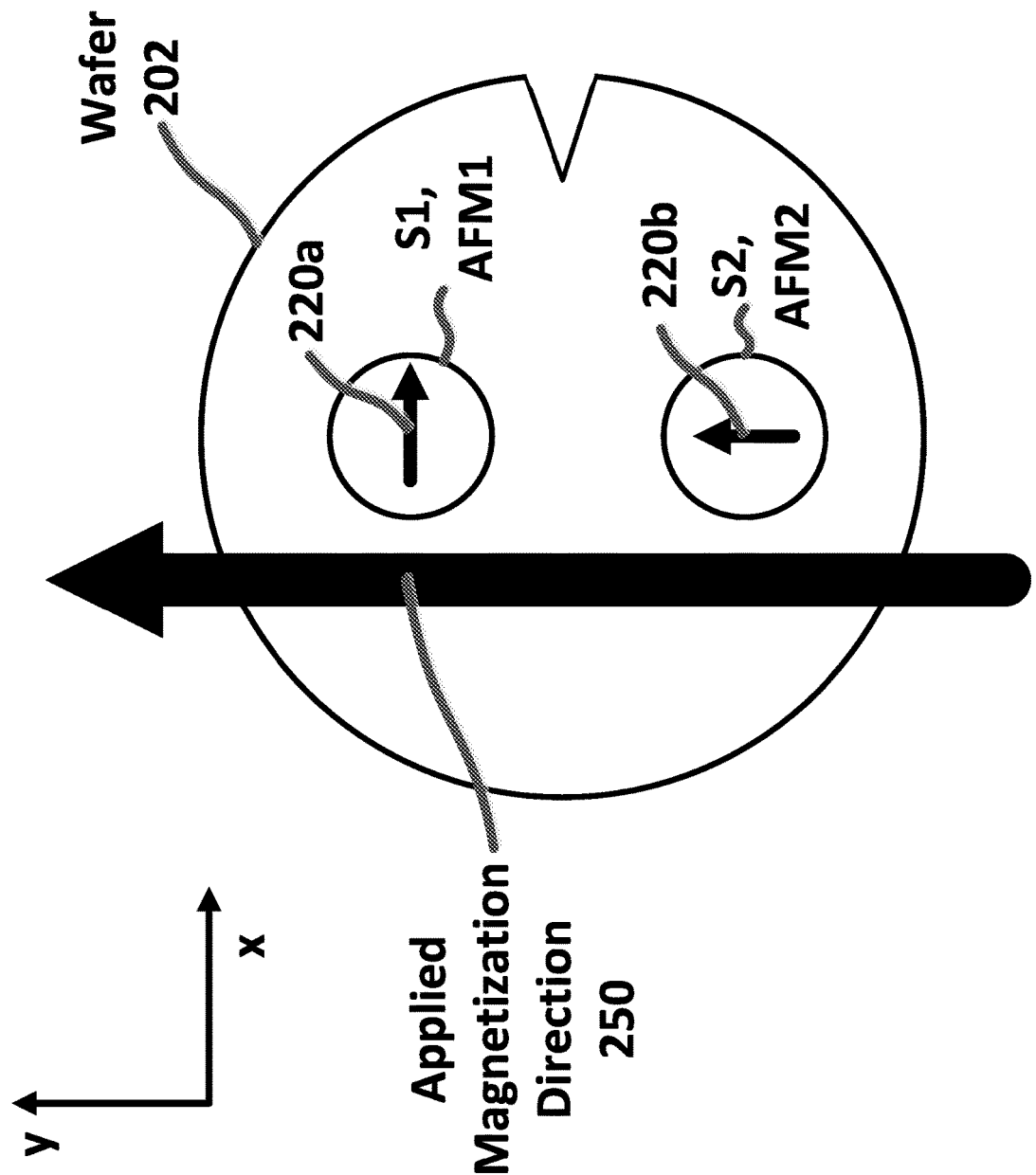

Referring to FIG. 2C, after cooling the wafer 202 and after enabling the temperature of the wafer 202 to be a second temperature greater than $T_{N(AF2)}$ and less than $T_{N(AF1)}$, a magnetic field 250 is applied to the wafer 202 in the y-direction. The magnetization direction 220b of AFM2 aligns with the applied magnetic field 250 and point in the y-direction, while the magnetization direction 220a of AFM1 remains aligned in the x-direction.

In other examples, additional stacks with AFM1 and AFM2 may be included so that one or more x-bridges and one or more y-bridges may be formed. For example, stacks with AFM1 may be used to form x-bridges and stacks with AFM2 may be used to form y-bridges.

Figure 3:
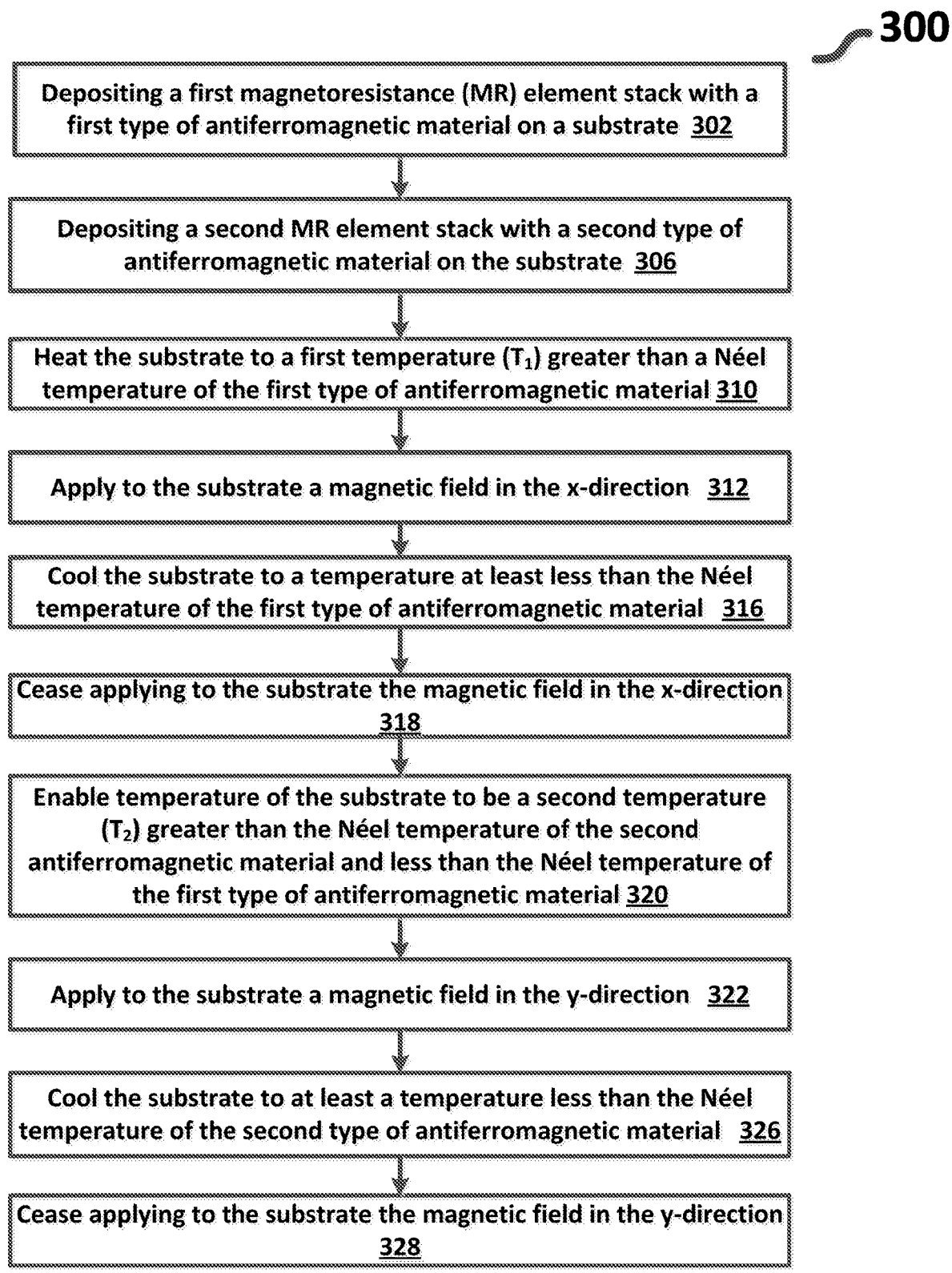
FIG. 3 is a flowchart of an example of a process to set magnetization directions for two types of antiferromagnetic materials having different Néel temperatures.

Referring to FIG. 3, an example of a process to set magnetization directions for two types of antiferromagnetic materials having different Néel temperatures from each other is a process 300. The process 300 may be used to fabricate two-dimensional angle sensors.

Process 300 deposits a first magnetoresistance (MR) element stack with a first type of antiferromagnetic material on a substrate (302). For example, the MR element stack S1 including AFM1 is deposited on the wafer 202 (FIG. 2A).

Process 300 deposits a second MR element stack with a second type of antiferromagnetic material on the substrate (306). For example, the MR element stack S2 including AFM2 is deposited on the wafer 202 (FIG. 2A).

Process 300 heats the substrate to a first temperature $T_1$ greater than a Néel temperature of the first type of antiferromagnetic material (310). For example, the wafer 202 is heated so that $T_1$ is greater than $T_{N(AF1)}$ (FIG. 2B).

Process 300 applies to the substrate a magnetic field in the x-direction (312). For example, a magnetic field 240 in the x-direction is applied to the wafer 202 and the magnetization direction 220a of AFM1 and the magnetization direction 220b of AFM2 align with the applied magnetic field 240 and point in the x-direction (FIG. 2B).

Process 300 cools the substrate to a temperature at least less than the Néel temperature of the first type of antiferromagnetic material (316). For example, the wafer 202 cools to a temperature at least less than $T_{N(AF1)}$ (FIG. 2B). In one example, the wafer 202 is cooled to a temperature at least less than 417° C.

Process 300 ceases applying to the substrate the magnetic field in the x-direction (318). For example, the magnetic field 240 in the x-direction is no longer applied to the wafer 202.

Process 300 enables a temperature of the substrate to be a second temperature ($T_2$) greater than the Néel temperature of the second type of antiferromagnetic material and less than the Néel temperature of the first type of antiferromagnetic material (320). For example, the wafer 202 is heated so that $T_2$ is greater than $T_{N(AF2)}$ and less than $T_{N(AF1)}$ (FIG. 2C).

Process 300 applies to the substrate a magnetic field in the y-direction (322). For example, a magnetic field 250 in the y-direction is applied to the wafer 202 and the magnetization direction 220b of AFM2 aligns with the applied magnetic field 250 and point in the y-direction (FIG. 2C).

Process 300 cools the substrate to a temperature at least less than the Néel temperature of the second type of antiferromagnetic material (326). For example, the wafer 202 cools to a temperature at least less than $T_{N(AF2)}$ (FIG. 2C). In one example, the wafer 202 is cooled to a temperature at least less than 257° C.

Process 300 ceases applying to the substrate the magnetic field in the y-direction (328). For example, the magnetic field 250 in the y-direction is no longer applied to the wafer 202.

Figure 4A:
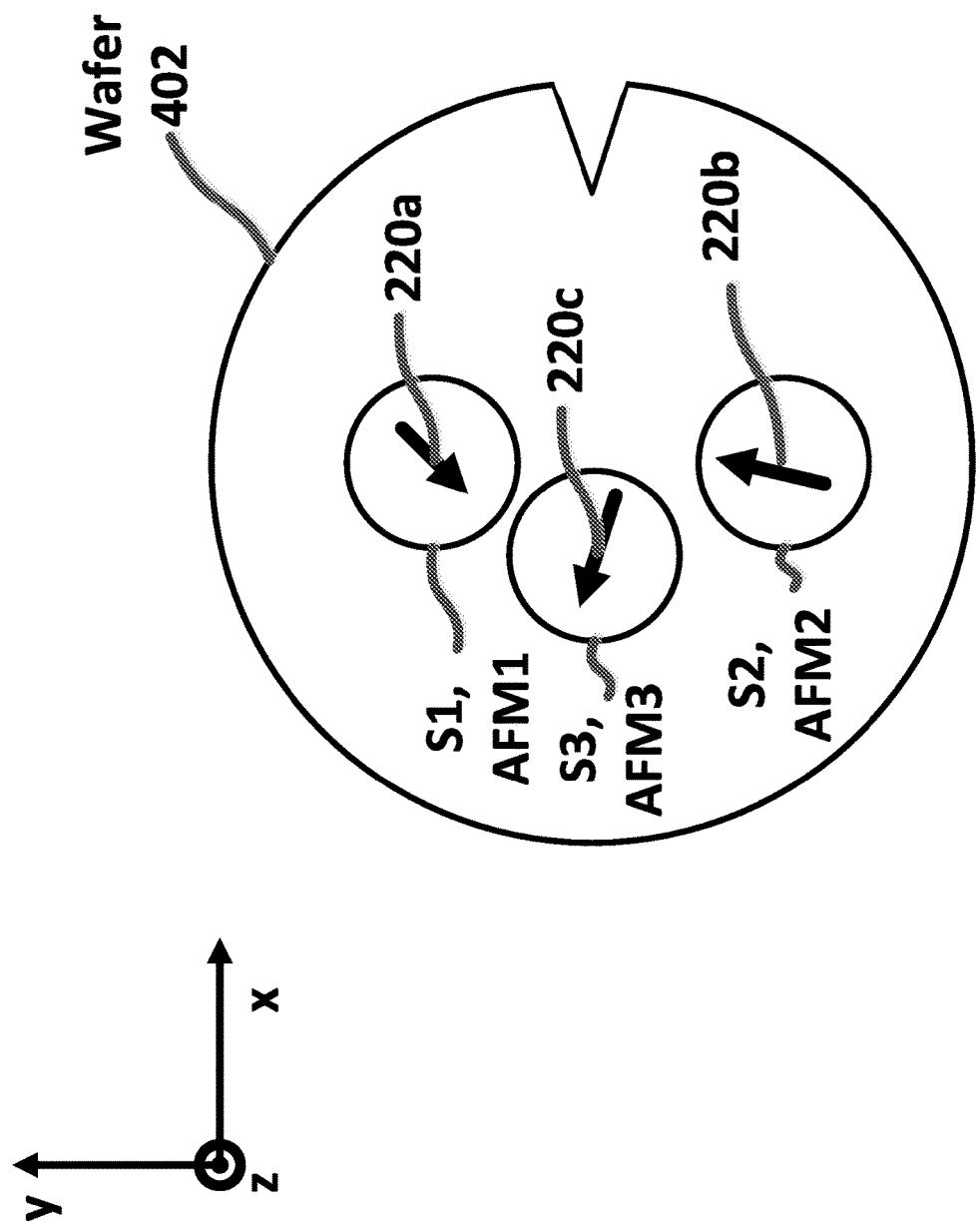
FIGS. 4A to 4D are diagrams depicting setting magnetization directions for three types of antiferromagnetic materials having different Néel temperatures.

Referring to FIG. 4A, the techniques herein may also be applied to a three-dimensional angle sensor. A wafer 402 includes the first MR stack S1 with the AFM1, the second MR stack S2 with AFM2, and a third MR stack S3 with a third type of antiferromagnetic material (AFM3). The AFM3 has a Néel temperature $T_{N(AF3)}$, where $T_{N(AF1)} > T_{N(AF2)} > T_{N(AF3)}$. The AFM3 has a magnetization direction 220c.

In one example, AFM1 may be iridium manganese (IrMn), iron manganese (FeMn), or platinum manganese (PtMn). In another example, AFM2 may be iridium manganese (IrMn), iron manganese (FeMn), or platinum manganese (PtMn). In a further example, AFM3 may be iridium manganese (IrMn), iron manganese (FeMn), or platinum manganese (PtMn). The examples in the paragraph are limited to $T_{N(AF1)} > T_{N(AF2)} > T_{N(AF3)}$.

Figure 4B:
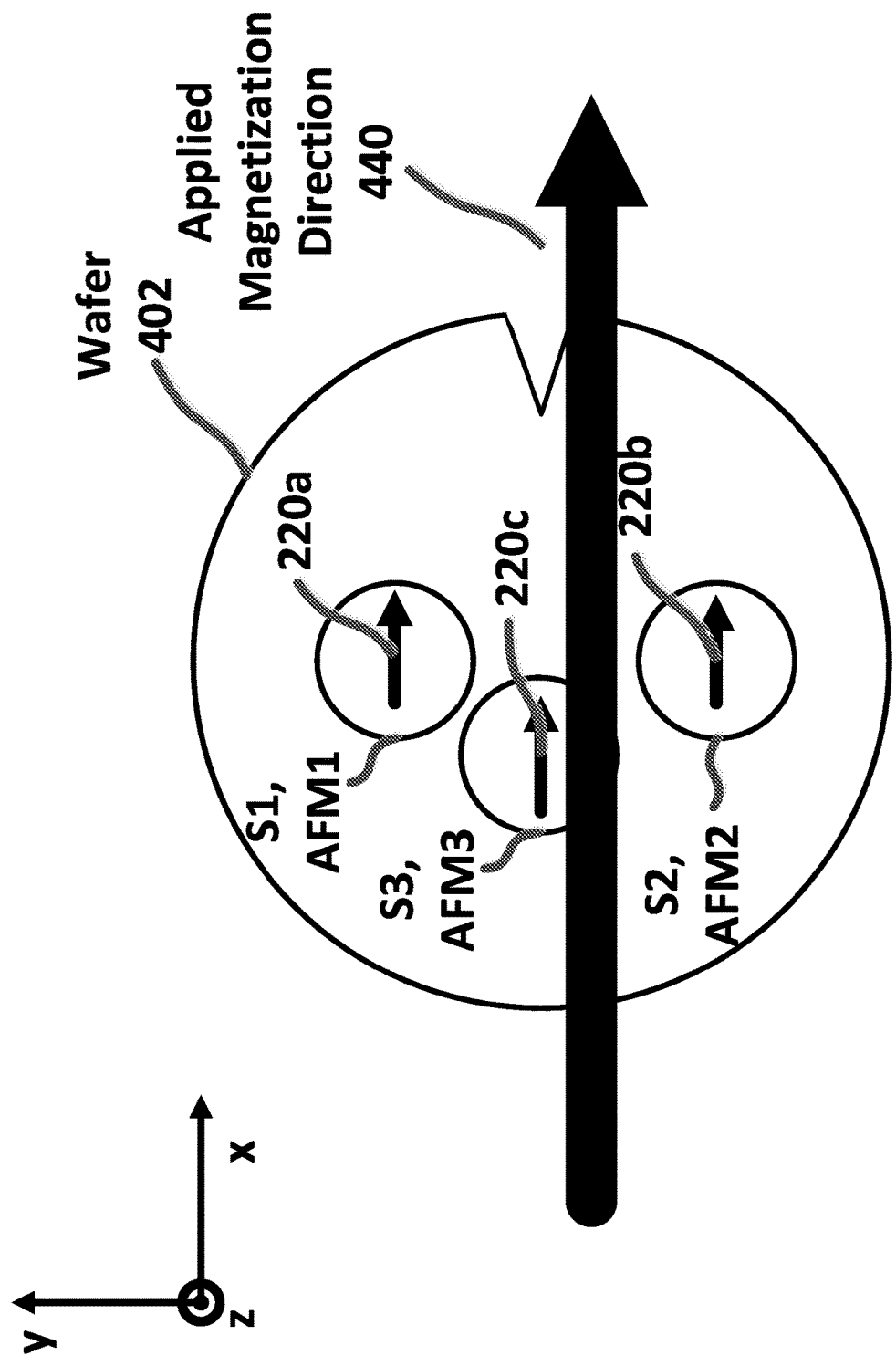

Referring to FIG. 4B, after heating the wafer 402 to a first temperature greater than $T_{N(AF1)}$, a magnetic field 440 is applied to the wafer 402 in the x-direction. The magnetization direction 220a of AFM1, the magnetization direction 220b of AFM2, and the magnetization direction 220c of AFM3 align with the applied magnetic field 440 and point in the x-direction.

Figure 4C:
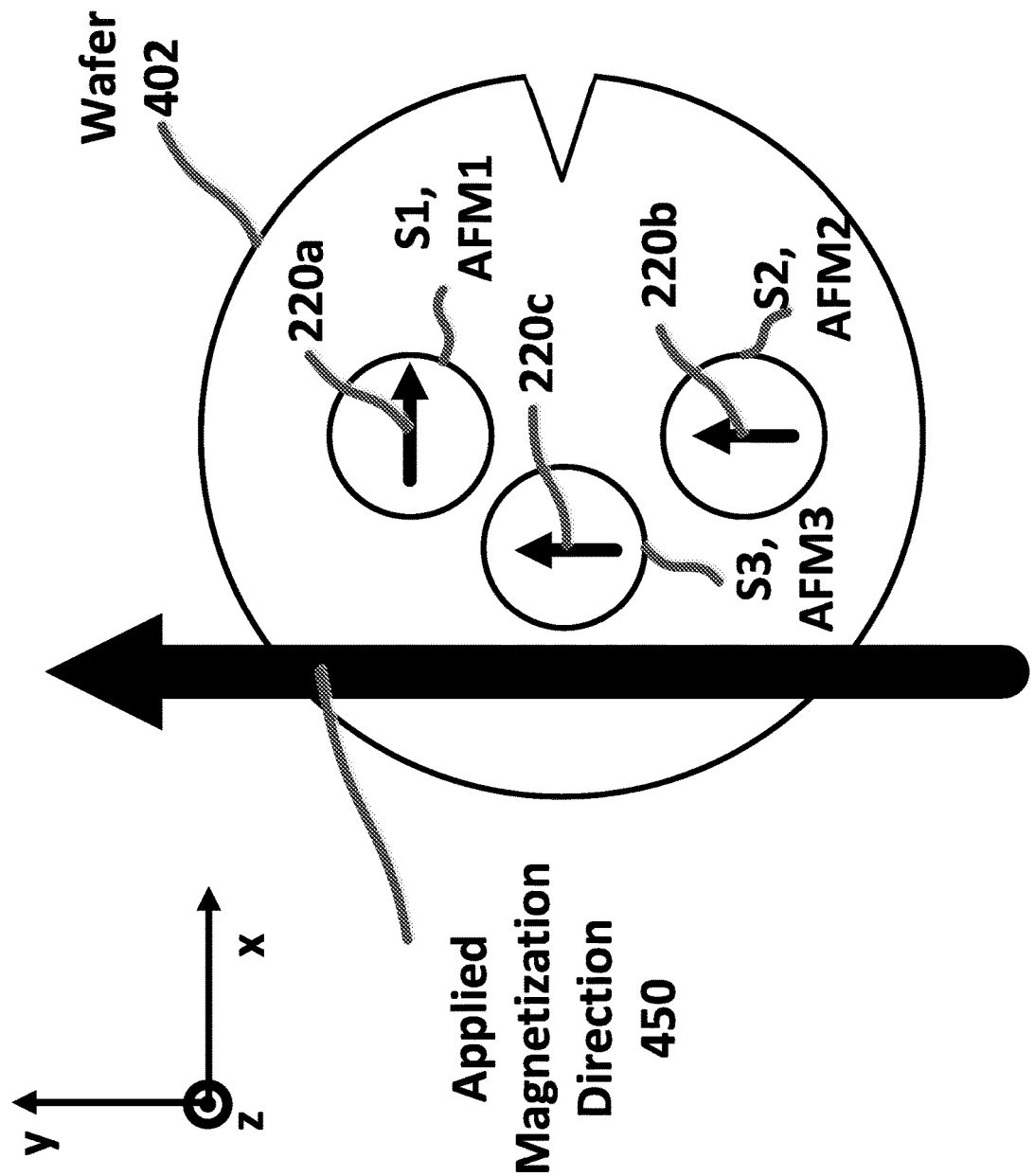

Referring to FIG. 4C, after cooling the wafer 402 and after enabling the temperature of the wafer 402 to be a second temperature greater than $T_{N(AF2)}$ and less than $T_{N(AF1)}$, a magnetic field 450 is applied to the wafer 402 in the y-direction. The magnetization direction 220b of AFM2 and the magnetization direction 220c of AFM3 align with the applied magnetic field 450 and point in the y-direction.

Figure 4D:
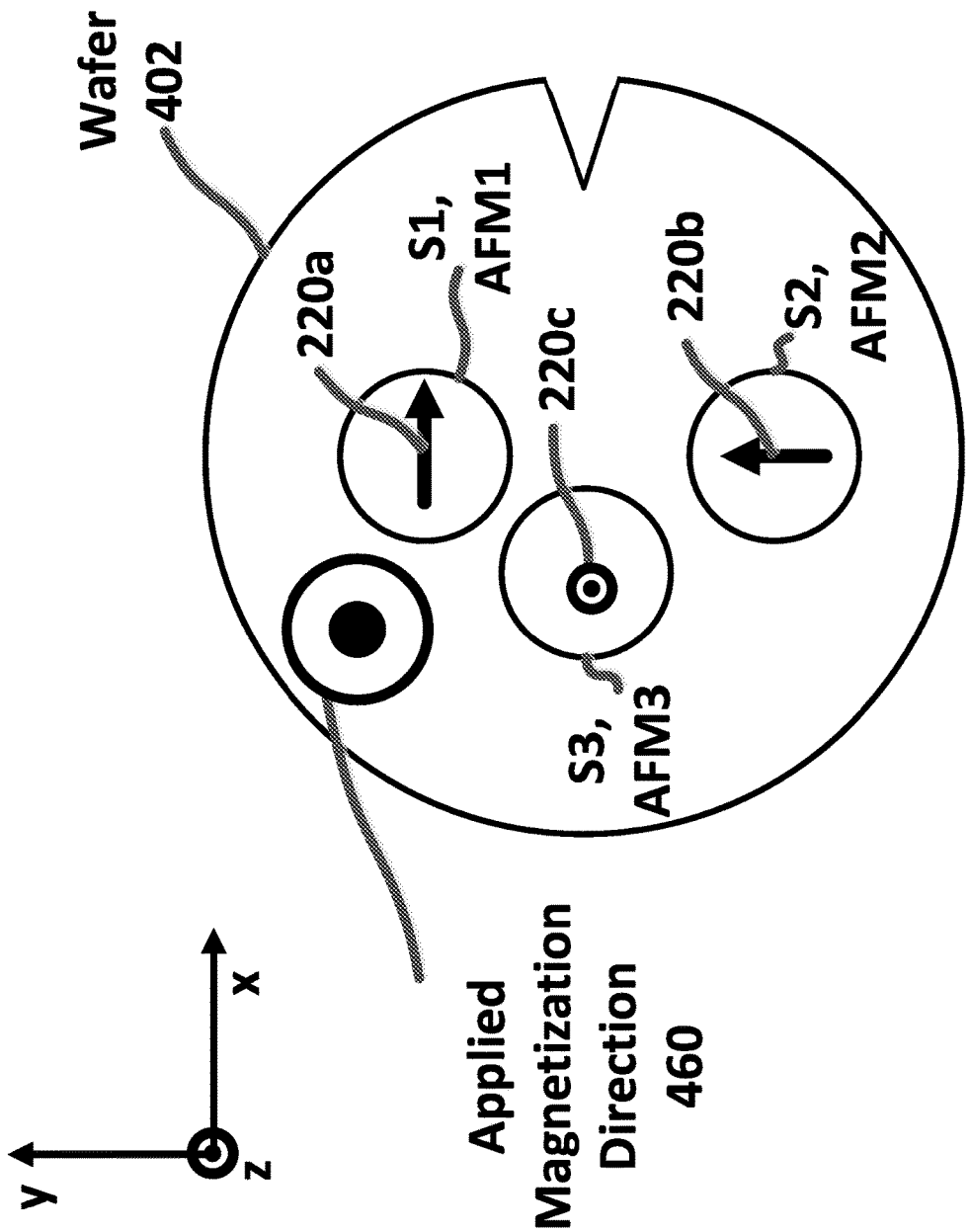

Referring to FIG. 4D, after cooling the wafer 402 and after enabling the temperature of the wafer 402 to be a third temperature greater than $T_{N(AF3)}$ and less than $T_{N(AF2)}$, a magnetic field 460 is applied to the wafer 402 in the z-direction. The magnetization direction 220c of AFM3 aligns with the applied magnetic field 460 and point in the z-direction.

Figure 5:
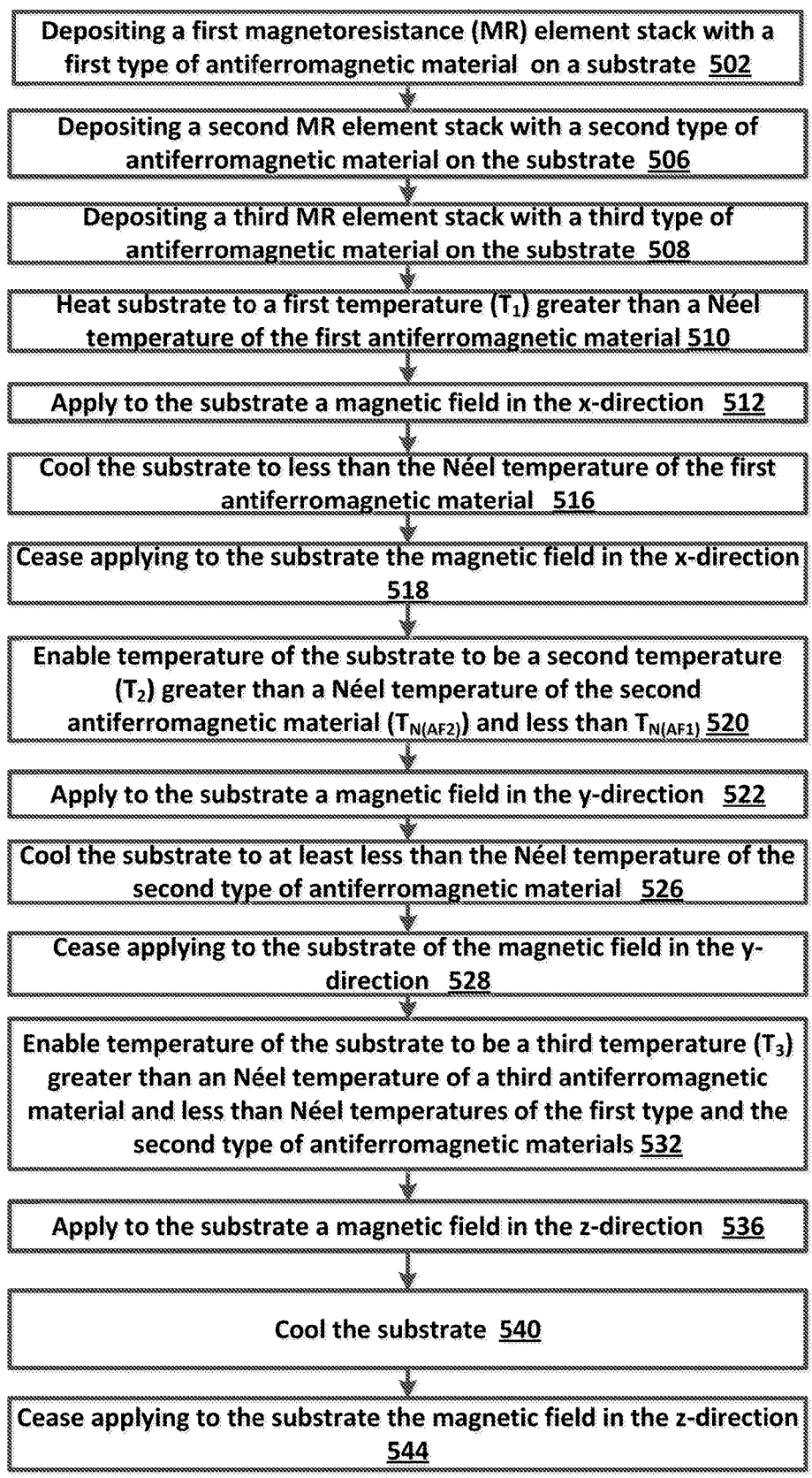
FIG. 5 is a flowchart of an example of a process to set magnetization directions for three types of antiferromagnetic materials Néel temperatures.

Referring to FIG. 5, an example of a process to set magnetization directions for three types of antiferromagnetic materials having different Néel temperatures from each other is a process 500. The process 500 may be used to fabricate three-dimensional angle sensors.

Process 500 deposits a first magnetoresistance (MR) element stack with a first type of antiferromagnetic material on a substrate (502). For example, the MR element stack S1 including AFM1 is deposited on the wafer 402 (FIG. 4A).

Process 500 deposits a second MR element stack with a second type of antiferromagnetic material on the substrate (506). For example, the MR element stack S2 including AFM2 is deposited on the wafer 402 (FIG. 4A).

Process 500 deposits a third MR element stack with a third type of antiferromagnetic material on the substrate (508). For example, the MR element stack S3 including AFM3 is deposited on the wafer 402 (FIG. 4A).

Process 500 heats the substrate to a first temperature $T_1$ greater than a Néel temperature of the first type of antiferromagnetic material (510). For example, the wafer 402 is heated so that $T_1$ is greater than $T_{N(AF1)}$ (FIG. 4B).

In other examples, additional stacks with AFM1, AFM2, AFM3 may be included so that one or more x-bridges, one or more y-bridges and one or more z-bridges may be formed. For example, stacks with AFM1 may be used to form x-bridges, stacks with AFM2 may be used to form y-bridges and stacks with AFM3 may be used to form one or more z-bridges.

Process 500 applies to the substrate a magnetic field in the x-direction (512). For example, an applied magnetic field 440 in the x-direction is applied to the wafer 402 and the magnetization direction 220a of AFM1, the magnetization direction 220b of AFM2 and the magnetization direction 220c of AFM3 align with the applied magnetic field 440 and point in the x-direction (FIG. 4B).

Process 500 cools the substrate to a temperature at least less than the Néel temperature of the first type of antiferromagnetic material (516). For example, the wafer 402 is cooled to a temperature at least less than $T_{N(AF1)}$ (FIG. 4B). In one example, the wafer 402 is cooled to a temperature at least less than 417° C.

Process 500 ceases applying to the substrate the magnetic field in the x-direction (518). For example, the magnetic field 440 in the x-direction is no longer applied to the wafer 402.

Process 500 enables a temperature of the substrate to be a second temperature ($T_2$) greater than the Néel temperature of the second type of antiferromagnetic material and less than the Néel temperature of the first type of antiferromagnetic material (520). For example, the wafer 402 is heated so that $T_2$ is greater than $T_{N(AF2)}$ but less than $T_{N(AF1)}$ (FIG. 4C).

Process 500 applies to the substrate a magnetic field in the y-direction (522). For example, an applied magnetic field 450 in the y-direction is applied to the wafer 402 and the magnetization direction 220b of AFM2 and the magnetization direction 220c of AMF3 align with the applied magnetic field 250 and point in the y-direction (FIG. 4C).

Process 500 cools the substrate to a temperature at least less than the Néel temperature of the second type of antiferromagnetic material (526). For example, the wafer 402 cools to a temperature at least less than $T_{N(AF2)}$ (FIG. 4C). In one example, the wafer 402 is cooled to a temperature at least less than 257° C.

Process 500 ceases applying to the substrate the magnetic field in the y-direction (528). For example, the applied magnetic field 450 in the y-direction is no longer applied to the wafer 402.

Process 500 enables temperature of the substrate to be a third temperature ($T_3$) greater than an Néel temperature of a third antiferromagnetic material and less than Néel temperatures of the first type and the second type of antiferromagnetic materials (532). For example, the wafer 402 is heated so that $T_3$ is greater than $T_{N(AF3)}$, but less than $T_{N(AF2)}$ and less than $T_{N(AF1)}$ (FIG. 4C).

Process 500 applies to the substrate a magnetic field in the z-direction (536). For example, a magnetic field 460 in the y-direction is applied to the wafer 402 and the magnetization direction 220c of AFM3 aligns with the applied magnetic field 460 and point in the z-direction (FIG. 4D).

Process 500 cools the substrate to a temperature at least less than the Néel temperature of the third type of antiferromagnetic material (540). For example, the wafer 402 cools to a temperature at least less than $T_{N(AF3)}$ (FIG. 4D). In one example, the wafer 402 is cooled to a temperature at least less than 217° C.

Process 500 ceases applying to the substrate the magnetic field in the z-direction (544). For example, the applied magnetic field 460 in the z-direction is no longer applied to the wafer 402.

The processes described herein are not limited to the specific examples described. For example, the processes 300 and 500 are not limited to the specific processing order of FIGS. 3 and 5, respectively. Rather, any of the processing blocks of FIGS. 3 and 5 may be re-ordered, combined, or removed, performed in parallel or in serial, as necessary, to achieve the results set forth above.

Bridges (e.g., x-bridge, y-bridge, z-bridge) include at least four MR elements. MR elements in a bridge may include TMR elements and/or GMR elements. The processes (e.g., the process 300, the process 500) may be used to form one or more of the MR elements in a bridge. In one particular example, the processes (e.g., the process 300, the process 500) may be used to form all of the MR elements in a bridge.

In other examples, in the processes 300 and 500, the MR element stack may be heated to a temperature less than the Néel temperature of an antiferromagnetic material. In particular, the temperature at which there exists no exchange biasing is known as the blocking temperature, Tb. This temperature is below the Néel temperature, Tn. At T=Tb, the FM layer is not exchange biased and is free to rotate and orient its magnetic spins along any direction, but the AF layer remains ordered since Tb<Tn. Therefore, it is possible to induce a certain amount of biasing by heating the sample to a temperature greater than Tb but less than Tn and then cooling it in the presence of a field. It should be noted that cooling the wafer in the presence of a field from the Néel temperature as well as the blocking temperature naturally, allows the reorientation of the magnetization along the applied field cooling direction.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
   manufacturing a magnetic-field angle sensor comprising:
      heating, to a first temperature, a substrate comprising:
         heating a first magnetoresistance (MR) element comprising a first type of antiferromagnetic material having a first Néel temperature and a first magnetization direction;
         heating a second MR element comprising a second type of antiferromagnetic material having a second Néel temperature and a second magnetization direction, wherein the first Néel temperature is greater than the second Néel temperature, wherein the first temperature is greater than the first Néel temperature;
      after heating the substrate to the first temperature, applying a first magnetic field to the substrate in an x-direction to enable the first magnetization direction and the second magnetization direction to be in the x-direction;
      cooling the substrate to a temperature less than the first Néel temperature while applying the first magnetic field;
      enabling a temperature of the substrate to be a second temperature after ceasing to apply the first magnetic field, wherein the second temperature is less than the first Néel temperature and greater than the second Néel temperature; and
      applying a second magnetic field to the substrate in a y-direction to enable the second magnetization direction to be in the y-direction,
      wherein the heating, to the first temperature, further comprises heating a third MR element comprising a third type of antiferromagnetic material having a third Néel temperature and a third magnetization direction, wherein the second Néel temperature is greater than the third Néel temperature.

2. The method of claim 1, wherein the manufacturing further comprises cooling the substrate to a temperature less than the second Néel temperature while applying the second magnetic field.

3. The method of claim 1, wherein the manufacturing further comprises ceasing to apply the second magnetic field.

4. The method of claim 1, wherein applying the first magnetic field to the substrate in the x-direction to enable the first magnetization direction and the second magnetization direction to be in the x-direction comprises applying the first magnetic field to the substrate in the x-direction to enable the first magnetization direction, the second magnetization direction and the third magnetization direction to be in the x-direction.

5. The method of claim 4, wherein applying the second magnetic field to the substrate in the y-direction to enable the second magnetization direction to be in the y-direction comprises applying the second magnetic field to the substrate in the y-direction to enable the second magnetization direction and the third magnetization direction to be in the y-direction.

6. The method of claim 5, wherein the manufacturing further comprises:
   cooling the substrate to a temperature less than the second Néel temperature while applying the second magnetic field;
   ceasing to apply the second magnetic field;
   enabling a temperature of the substrate to be a third temperature after ceasing to apply the second magnetic field, wherein the third temperature is less than the second Néel temperature and greater than the third Néel temperature; and applying a third magnetic field to the substrate in a z-direction to enable the third magnetization direction to be in the z-direction.

7. The method of claim 6, wherein the manufacturing further comprises:
forming an x-bridge using the first MR element;
forming a y-bridge using the second MR element; and
forming a z-bridge using the third MR element.

8. The method of claim 7, wherein the first MR element is a giant magnetoresistance (GMR) element and/or a tunneling magnetoresistance (TMR) element,
wherein the second MR element is a GMR element and/or a TMR element, and
wherein the third MR element is a GMR element and/or a TMR element.

9. The method of claim 8, wherein the MR elements of the x-bridge, the y-bridge and the z-bridge are GMR elements and/or TMR elements.

10. The method of claim 1, wherein the manufacturing further comprises:
forming an x-bridge using the first MR element; and
forming a y-bridge using the second MR element.

11. The method of claim 10, wherein the first MR element is a giant magnetoresistance (GMR) element and/or a tunneling magnetoresistance (TMR) element, and
wherein the second MR element is a GMR element and/or a TMR element.

12. The method of claim 11, wherein the MR elements of the x-bridge and the y-bridge are GMR elements and/or TMR elements.

13. A method, comprising:
manufacturing a magnetic-field angle sensor comprising:
heating, to a first temperature, a substrate comprising:
heating a first magnetoresistance (MR) element comprising a first type of antiferromagnetic material having a first blocking temperature and a first magnetization direction;
heating a second MR element comprising a second type of antiferromagnetic material having a second blocking temperature and a second magnetization direction, wherein the first blocking temperature is greater than the second blocking temperature, wherein the first temperature is greater than the first blocking temperature;
after heating the substrate to the first temperature, applying a first magnetic field to the substrate in an x-direction to enable the first magnetization direction and the second magnetization direction to be in the x-direction;
cooling the substrate to a temperature less than the first blocking temperature while applying the first magnetic field;
enabling a temperature of the substrate to be a second temperature after ceasing to apply the first magnetic field, wherein the second temperature is less than the first blocking temperature and greater than the second blocking temperature; and
applying a second magnetic field to the substrate in a y-direction to enable the second magnetization direction to be in the y-direction,
wherein the heating, to the first temperature, further comprises heating a third MR element comprising a third type of antiferromagnetic material having a third blocking temperature and a third magnetization direction, wherein the second blocking temperature is greater than the third blocking temperature,
wherein applying the first magnetic field to the substrate in the x-direction to enable the first magnetization direction and the second magnetization direction to be in the x-direction comprises applying the first magnetic field to the substrate in the x-direction to enable the first magnetization direction, the second magnetization direction and the third magnetization direction to be in the x-direction, and
wherein applying the second magnetic field to the substrate in the y-direction to enable the second magnetization direction to be in the y-direction comprises applying the second magnetic field to the substrate in the y-direction to enable the second magnetization direction and the third magnetization direction to be in the y-direction.

14. The method of claim 13, wherein the manufacturing further comprises cooling the substrate to a temperature less than the second blocking temperature while applying the second magnetic field.

15. The method of claim 13, wherein the manufacturing further comprises ceasing to apply the second magnetic field.

16. The method of claim 13, wherein the manufacturing further comprises:
cooling the substrate to a temperature less than the second blocking temperature while applying the second magnetic field;
ceasing to apply the second magnetic field;
enabling a temperature of the substrate to be a third temperature after ceasing to apply the second magnetic field, wherein the third temperature is less than the second blocking temperature and greater than the third blocking temperature; and
applying a third magnetic field to the substrate in a z-direction to enable the third magnetization direction to be in the z-direction.

17. The method of claim 16, wherein the manufacturing further comprises:
forming an x-bridge using the first MR element;
forming a y-bridge using the second MR element; and
forming a z-bridge using the third MR element.

18. The method of claim 17, wherein the first MR element is a giant magnetoresistance (GMR) element and/or a tunneling magnetoresistance (TMR) element,
wherein the second MR element is a GMR element and/or a TMR element, and
wherein the third MR element is a GMR element and/or a TMR element.

19. The method of claim 18, wherein the MR elements of x-bridge, the y-bridge and the z-bridge are GMR elements and/or TMR elements.

20. The method of claim 13, wherein the manufacturing further comprises:
forming an x-bridge using the first MR element; and
forming a y-bridge using the second MR element.

21. The method of claim 20, wherein the first MR element is a giant magnetoresistance (GMR) element and/or a tunneling magnetoresistance (TMR) element, and
wherein the second MR element is a GMR element and/or a TMR element.

22. The method of claim 21, wherein the MR elements of the x-bridge and the y-bridge are GMR elements and/or TMR elements.

* * * * *